(12) United States Patent
Prushinskiy et al.

(10) Patent No.: US 8,860,034 B2
(45) Date of Patent: Oct. 14, 2014

(54) ORGANIC LIGHT-EMITTING DISPLAY APPARATUS

(75) Inventors: Valeriy Prushinskiy, Yongin (KR); Len Kaplan, Yongin (KR); Se-Ho Cheong, Yongin (KR); Won-Sik Hyun, Yongin (KR); Byoung-Seong Jeong, Yongin (KR); Jang-Seok Ma, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 94 days.

(21) Appl. No.: 13/294,079

(22) Filed: Nov. 10, 2011

(65) Prior Publication Data

US 2012/0241772 A1 Sep. 27, 2012

(30) Foreign Application Priority Data

Mar. 21, 2011 (KR) .................. 10-2011-0024992

(51) Int. Cl.
*H01L 27/14* (2006.01)
*H01L 29/04* (2006.01)
*H01L 29/15* (2006.01)
*H01L 31/036* (2006.01)
*H01L 51/52* (2006.01)
*H01L 27/32* (2006.01)

(52) U.S. Cl.
CPC ......... *H01L 51/5281* (2013.01); *H01L 51/5271* (2013.01); *H01L 51/5275* (2013.01); *H01L 51/5203* (2013.01); *H01L 27/3244* (2013.01)
USPC ..................... 257/72; 257/E51.019

(58) Field of Classification Search
USPC .......... 257/59, 72, 88, 89, E51.001, E51.005, 257/E51.018, E51.022, E33.072, E51.019
See application file for complete search history.

(56) References Cited

U.S. PATENT DOCUMENTS

| | | | |
|---|---|---|---|
| 6,955,578 B2 | 10/2005 | Park et al. | |
| 7,282,855 B2 | 10/2007 | Park et al. | |
| 8,278,162 B2 * | 10/2012 | Akimoto et al. | 438/158 |
| 2004/0206960 A1 * | 10/2004 | Nishikawa | 257/72 |
| 2005/0073243 A1 * | 4/2005 | Yamazaki et al. | 313/498 |
| 2005/0082534 A1 * | 4/2005 | Kim et al. | 257/72 |
| 2005/0225232 A1 * | 10/2005 | Boroson et al. | 313/504 |
| 2006/0097264 A1 * | 5/2006 | Kim et al. | 257/72 |
| 2007/0152223 A1 * | 7/2007 | Kang et al. | 257/72 |
| 2007/0262708 A1 * | 11/2007 | Tanaka et al. | 313/504 |
| 2008/0216926 A1 | 9/2008 | Guo et al. | |

(Continued)

FOREIGN PATENT DOCUMENTS

JP 2008-071578 A 3/2008
KR 2003-0044744 A 6/2003

(Continued)

*Primary Examiner* — Daniel Luke
*Assistant Examiner* — Latanya N Crawford
(74) *Attorney, Agent, or Firm* — Knobbe Martens Olson & Bear LLP (57) ABSTRACT

An organic light-emitting display apparatus including: a first substrate; a second substrate disposed to face the first substrate; a first electrode disposed between the first substrate and the second substrate and a second electrode disposed to face the first electrode; and an organic light-emitting layer disposed between the first electrode and the second electrode, wherein at least one of the first electrode and the second electrode is a reflective electrode, and an optical property modification layer having at least one optical property modified from that of the reflective electrode is formed on a surface of the reflective layer.

17 Claims, 9 Drawing Sheets

(56) References Cited

U.S. PATENT DOCUMENTS

| | | | |
|---|---|---|---|
| 2009/0179560 A1* | 7/2009 | Chun et al. | 313/504 |
| 2010/0148192 A1* | 6/2010 | Jung et al. | 257/88 |
| 2010/0221855 A1* | 9/2010 | Yamazaki et al. | 438/29 |
| 2010/0327268 A1* | 12/2010 | Kubota | 257/40 |
| 2011/0062861 A1* | 3/2011 | Lee et al. | 313/504 |
| 2011/0272675 A1* | 11/2011 | Chung et al. | 257/40 |
| 2012/0049191 A1* | 3/2012 | You et al. | 257/59 |

FOREIGN PATENT DOCUMENTS

| | | |
|---|---|---|
| KR | 10-2005-0015821 A | 2/2005 |
| KR | 10-2005-0110537 A | 11/2005 |
| KR | 10-2005-0119894 A | 12/2005 |
| WO | 2008-097374 A2 | 8/2008 |

* cited by examiner

ORGANIC LIGHT-EMITTING DISPLAY APPARATUS

CROSS-REFERENCE TO RELATED PATENT APPLICATION

This application claims the benefit of Korean Patent Application No. 10-2011-0024992, filed on Mar. 21, 2011, in the Korean Intellectual Property Office, the disclosure of which is incorporated herein in its entirety by reference.

BACKGROUND

1. Field

The present disclosure relates to organic light-emitting display apparatuses, and more particularly, to organic light-emitting display apparatuses capable of minimizing a decrease in contrast due to the reflection of external light.

2. Description of the Related Art

An organic light-emitting display apparatus is a self-emitting type display apparatus that has wide viewing angles and quick response speeds. However, when the organic light-emitting display apparatus displays an image in an external light environment, the contrast of the organic light-emitting display apparatus may decrease due to the reflection of the external light by a metal constituting electrodes and wirings in the display apparatus.

In general, an expensive polarization plate is used to minimize the decrease in contrast. However, the use of a polarization plate causes other problems such as cost increase, reduction in transmittivity due to blocking light emitted from a light-emitting layer, and decrease in luminance.

To minimize a decrease in contrast, a black matrix is formed on electrodes or wirings. However, if a black matrix is used, an additional mask process is required to form the black matrix, which makes the manufacturing process complicated.

SUMMARY

One or more embodiments of the present invention provide an organic light-emitting display apparatus with enhanced contrast characteristics by modifying the optical properties of a surface of a reflective electrode.

According to an aspect of the present invention, there is provided an organic light-emitting display apparatus comprising: a first substrate; a second substrate disposed to face the first substrate; a first electrode disposed between the first substrate and the second substrate and a second electrode disposed to face the first electrode; and an organic light-emitting layer disposed between the first electrode and the second electrode, wherein at least one of the first electrode and the second electrode is a reflective electrode, and wherein an optical property modification layer having at least one optical property modified from that of the reflective electrode is formed on a surface of the reflective electrode.

The optical property modification layer may have a lower reflectivity than the reflective electrode.

The optical property modification layer may have a higher light absorption ratio than the reflective electrode.

The at least one optical property of the optical property modification layer is one selected from the group consisting of transmittivity, refractive index, diffraction, and color, and the at least one optical property of the optical property modification layer—may be different from that of the reflective electrode.

The optical property modification layer may be formed by applying a femtosecond duration laser beam pulse at least once to the reflective electrode.

An area of the optical property modification layer that is modified by the femtosecond duration laser beam may have a nano-scale or micro-scale size.

The optical property modification layer may be formed on one of two surfaces of the reflective electrode that faces the organic light-emitting layer.

Light emitted from the organic light-emitting layer may be emitted toward the second substrate, the optical property modification layer may be formed on a surface of the first electrode that is nearer to the organic light-emitting layer, and a light-blocking layer may further be formed between the first substrate and the organic light-emitting layer.

The organic light-emitting display apparatus may further comprise at least one thin-film transistor (TFT) connected to the first electrode and at least one wiring portion connected to the at least one TFT, wherein the at least one TFT and the at least one wiring portion are formed between the first substrate and the second substrate, and the light-blocking layer is formed between the at least one TFT and the first electrode or between the at least one wiring portion and the first electrode.

The light-blocking layer may be formed on an area in which the optical property modification layer is not formed.

Light emitted from the organic light-emitting layer may be emitted toward the first substrate, and the optical property modification layer may be formed on a surface of the second electrode that is nearer to the organic light-emitting layer, and a light-blocking layer may be further formed between the first substrate and the first electrode.

The organic light-emitting display apparatus may further comprise at least one thin-film transistor (TFT) connected to the first electrode and at least one wiring portion connected to the at least one TFT, wherein the at least one TFT and the at least one wiring portion are formed between the first substrate and the second substrate, and the light-blocking layer is formed between the at least one TFT and the first electrode or between the at least one wiring portion and the first electrode.

The light-blocking layer may be formed on an area in which the optical property modification layer is not formed.

At least one of the first substrate and the second substrate may be at least one transparent substrate, and a transparent interference layer may further be formed on a surface of the transparent substrate through which external light is incident.

The transparent interference layer may have a thickness equivalent to about ¼ wavelength of the external light.

The transparent interference layer may have a smaller refractive index than a refractive index of the transparent substrate.

The transparent interference layer may comprise at least one material selected from the group consisting of magnesium fluoride, silica, and a highly refractive transparent material.

The at least one transparent interference layer comprises a first transparent interference layer and a second transparent interference layer which is closer to the transparent substrate than the first transparent interference layer and has a refractive index higher than that of the first transparent interference layer.

The at least one transparent interference layer comprises a plurality of transparent interference layers, each of which may have a thickness equivalent to about ¼ wavelength of the external light.

BRIEF DESCRIPTION OF THE DRAWINGS

The above and other features and advantages of the present invention will become more apparent by describing in detail embodiments thereof with reference to the attached drawings in which.

DETAILED DESCRIPTION OF EMBODIMENTS

Embodiments of the present invention will now be described more fully with reference to the accompanying drawings, in which embodiments of the invention are shown.

Figure 1:
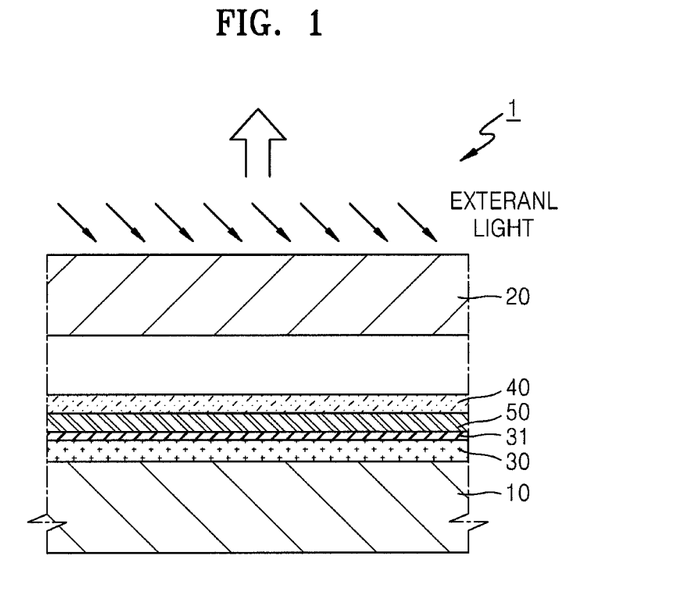
FIG. 1 is a cross-sectional view illustrating a top emission type organic light-emitting display apparatus according to an embodiment of the present invention.

FIG. 1 is a cross-sectional view illustrating a top emission type organic light-emitting display apparatus 1 according to an embodiment of the present invention.

Referring to FIG. 1, the organic light-emitting display apparatus 1 includes a first substrate 10, a second substrate 20, a first electrode 30, an optical property modification layer 31 formed on a surface of the first electrode 30, an organic light-emitting layer 50, and a second electrode 40.

The first substrate 10 and the second substrate 20 are disposed to face each other. The first substrate 10 may be a transparent substrate. However, since light emitted from the organic light-emitting layer 50 is transmitted toward the second substrate 20 in the current embodiment, the first substrate 10 may not be a transparent substrate. However, the second substrate 20 needs to be a transparent substrate.

The organic light-emitting layer 50 is disposed between the first electrode 30 and the second electrode 40. The first electrode 30 is a reflective electrode, and the second electrode 40 is a transparent electrode.

The first electrode 30 may be formed of at least one selected from the group consisting of aluminum (Al), silver (Ag), magnesium (Mg), gold (Au), platinum (Pt), palladium (Pd), nickel (Ni), neodymium (Nd), iridium (Ir), and chromium (Cr). The second electrode 40 may be formed of at least one selected from the group consisting of indium tin oxide (ITO), indium zinc oxide (IZO), zinc oxide (ZnO), and indium oxide ($In_2O_3$).

In the case of a passive matrix type (PM) apparatus, a pattern of the first electrodes 30 may have strip lines that are spaced apart from one another by a predetermined distance, and in the case of an active matrix (AM) type apparatus, a pattern of the first electrodes 30 may have arrangement corresponding to pixels. In the AM type apparatus, a thin-film transistor (TFT) layer comprising at least one TFT is further disposed in the first substrate 10 below the first electrode 30, and the first electrode 30 is electrically connected to the TFT layer. The second electrode 40 may be strip lines that perpendicularly cross the pattern of the first electrode 30 in the PM type apparatus, and in the AM type apparatus, in the form that corresponds to pixels. In the AM type apparatus, the second electrode 40 may be formed completely on an active area where an image is formed, as will be described more in detail below.

Light emitted from the organic light-emitting layer 50 is emitted toward the second substrate 20. External light is incident into the organic light-emitting display apparatus 1 through the second substrate 20, is reflected by the surface of the first electrode 30, which is a reflective electrode, and is emitted together with the light emitted from the organic light-emitting layer 50. Here, the reflected external light may decrease a contrast of the organic light-emitting display apparatus 1.

However, since the optical property modification layer 31, which has a lower reflectivity than that of the first electrode 30, is formed on an upper surface of the first electrode 30, which is a reflective electrode, in the organic light-emitting display apparatus 1, the reflection of external light may be reduced.

The optical property modification layer 31 is formed by, for example, surface treating of the first electrode 30 to have has the modified optical properties different from the optical properties of the first electrode 30. For example, at least one optical property among reflectivity, light absorption ratio, transmittivity, refractive index, diffraction, and color of a metal constituting the first electrode 30 may be modified to form the optical property modification layer 31. According to the current embodiment, the optical property modification layer 31 has a lower reflectivity and a higher light absorption ratio than an original metal that constitutes the first electrode 30, and thus, may reduce the reflection of external light, thereby improving a contrast.

According to the International Patent Application No. WO 2008/097374 published on Aug. 14, 2008 under the title "Ultra-short duration laser methods for the nanostructuring of materials" by Chunlei et al., which is incorporated by reference herein, a method of modifying the optical properties of a material is disclosed. According to the method, a femtosecond duration laser beam pulse is applied to a metal at least once so that a surface structure of an area that is modified by a laser beam has a nano-scale or micro-scale size, thereby modifying the optical properties of a metal surface.

Figure 2:
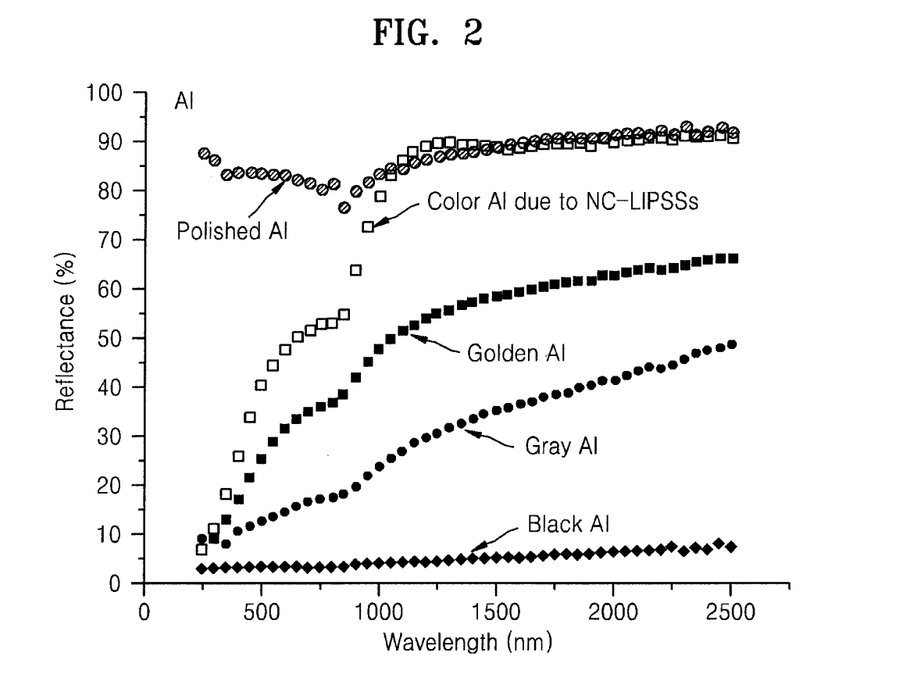
FIG. 2 illustrates reflectivity according to a wavelength of aluminum obtained when a femtosecond duration laser beam pulse is applied to aluminum, according to an embodiment of the present invention.

FIG. 2 illustrates reflectance according to wavelength of aluminum obtained by applying a Ti:sapphire laser system having a central wavelength of 800 nm and generating a 65 femtosecond pulse at a speed of about 1.1 mJ/pulse to aluminum, according to an embodiment of the present invention.

Referring to FIG. 2, compared to aluminum having an untreated surface in a wavelength range from 250 nm to 2500 nm (polished Al), the reflectivity of a surface-treated aluminum (e.g., Golden Al, Gray Al, and Black Al) is reduced. Also, change in a surface color of aluminum is shown.

When the first electrode 30 of the organic light-emitting display apparatus 1 is formed of aluminum, the optical property modification layer 31 may be formed of a surface-treated aluminum which has a lower reflectivity or a higher light absorption ratio than aluminum that is not surface-treated, on an upper surface of the first electrode 30, and thus, the reflection of external light may be reduced.

Accordingly, according to the current embodiment of the present invention, without using an expensive polarization plate and without having to form a black matrix by performing an additional mask process, a contrast can be simply enhanced by modifying the optical properties of the previously formed first electrode 30.

Figure 3:
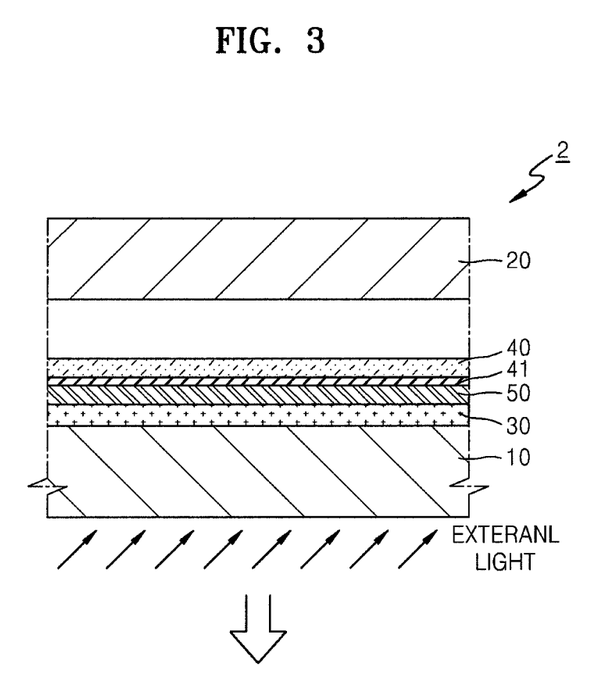
FIG. 3 is a cross-sectional view illustrating a bottom emission organic light-emitting display apparatus according to another embodiment of the present invention.

FIG. 3 is a cross-sectional view illustrating a bottom emission type organic light-emitting display apparatus 2 according to another embodiment of the present invention. Hereinafter, the description will focus on differences from the organic light-emitting display apparatus 1 of the previous embodiment, and like reference numerals in the drawings denote like elements.

Referring to FIG. 3, the organic light-emitting display apparatus 2 includes a first substrate 10, a second substrate 20, a first electrode 30, an organic light-emitting layer 50, a second electrode 40, and an optical property modification layer 41 formed on a surface of the second electrode 40.

Since the organic light-emitting display apparatus 2 is a bottom emission type in which light emitted from the organic light-emitting layer 50 is emitted toward the first substrate 10, the first substrate 10 is a transparent substrate. The first electrode 30 is a transparent electrode, and the second electrode 40 is a reflective electrode.

External light is transmitted through the first substrate 10 to be incident into the organic light-emitting display apparatus 2, is reflected by the surface of the second electrode 40 which is a reflective electrode, and is emitted together with light emitted from the organic light-emitting layer 50. Here, the reflected external light may decrease a contrast of the organic light-emitting display apparatus 2.

However, the organic light-emitting display apparatus 2 according to the current embodiment of the present invention includes the optical property modification layer 41 that is formed on the surface of the second electrode 40 which is a reflective electrode, the surface facing the organic light-emitting layer 50, and has a lower reflectivity than the second electrode 40, and thus, the reflection of the external light may be reduced.

Hereinafter, an organic light-emitting display apparatus 3 according to another embodiment of the present invention will be described with reference to FIGS. 4, 5, 6A, and 6B. Description of the organic light-emitting display apparatus 3 will focus on differences from the organic light-emitting display apparatus 2 of the previous embodiment, and like reference numerals in the drawings denote like elements.

Figure 4:
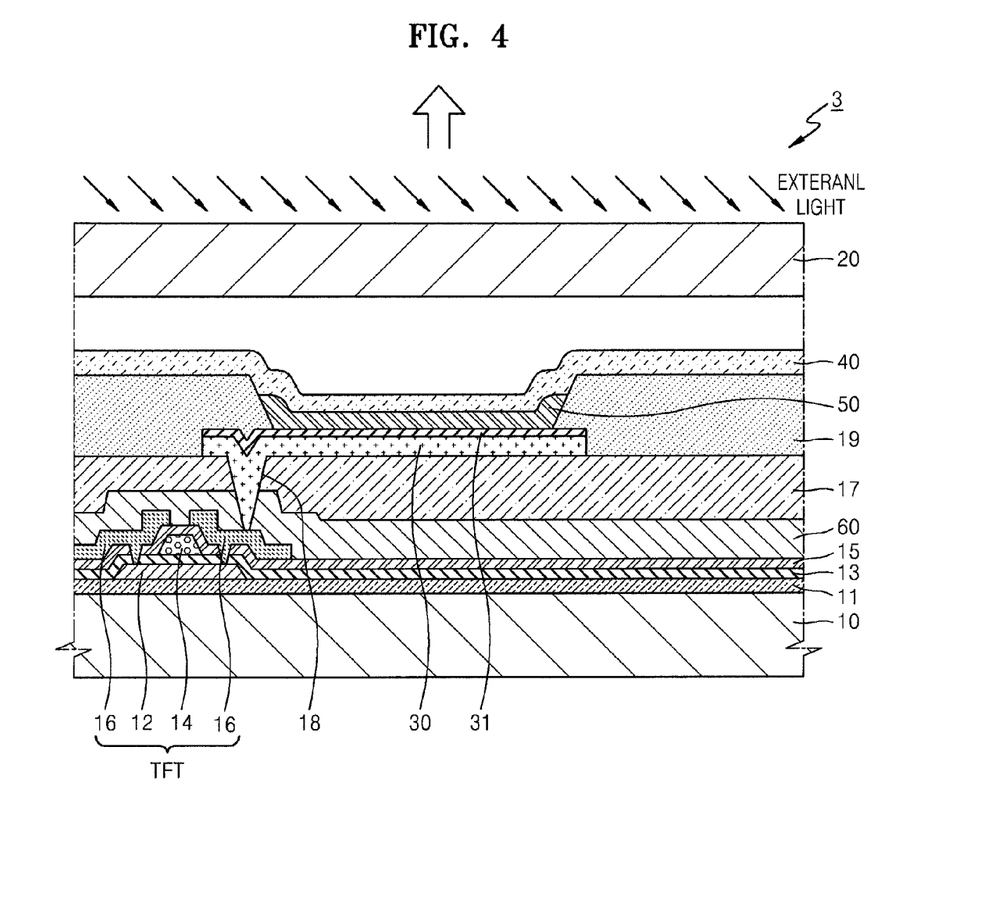
FIG. 4 is a cross-sectional view illustrating a top emission active matrix (AM) type organic light-emitting display apparatus according to another embodiment of the present invention.
Figure 5:
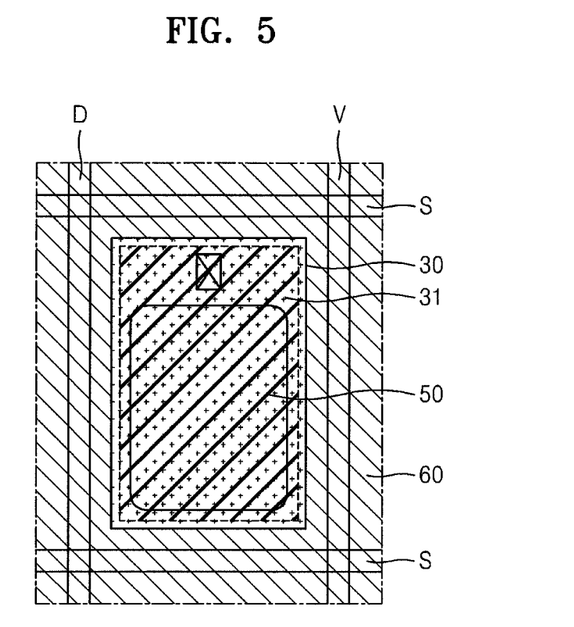
FIG. 5 is a plan view illustrating an optical property modification layer and a light-blocking layer of the organic light-emitting display apparatus of FIG. 4.
Figure 6A:
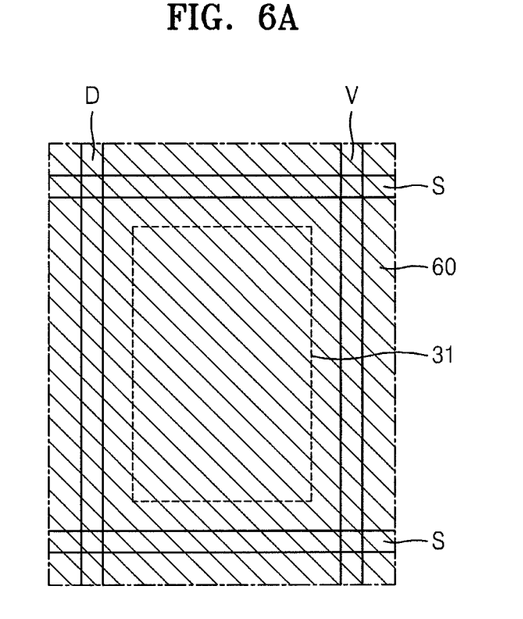
FIGS. 6A and 6B are schematic plan views illustrating a light-blocking layer of the organic light-emitting display apparatus of FIG. 4.
Figure 6B:
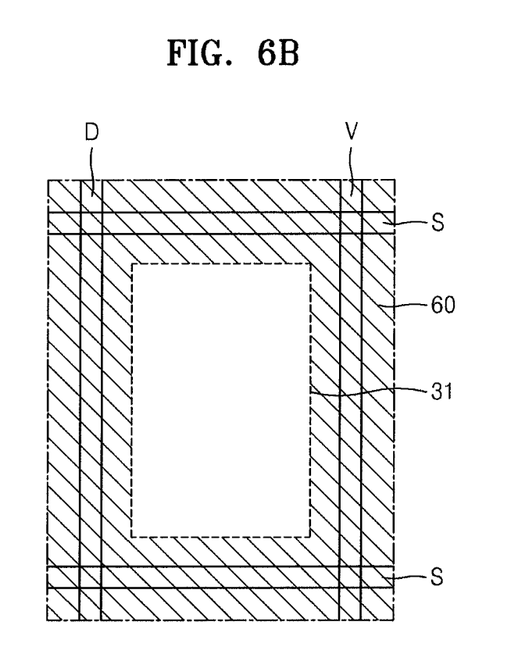

FIG. 4 is a cross-sectional view illustrating the top emission active matrix (AM) type organic light-emitting display apparatus 3 according to another embodiment of the present invention. FIG. 5 is a plan view illustrating an optical property modification layer 31 and a light-blocking layer 60 of the organic light-emitting display apparatus 3 according to the embodiment of FIG. 4. FIGS. 6A and 6B are schematic plan views illustrating the light-blocking layer 60 of the organic light-emitting display apparatus 3 according to the embodiment of FIG. 4.

Referring to FIGS. 4 and 5, the organic light-emitting display apparatus 3 includes a first substrate 10, a second substrate 20, a first electrode 30, the optical property modification layer 31 formed on a surface of the first electrode 30, an organic light-emitting layer 50, a second electrode 40, and the light-blocking layer 60.

The organic light-emitting display apparatus 3 is a top emission type in which light emitted from the organic light-emitting layer 50 is emitted toward the second substrate 20, and thus, the second substrate 20 is a transparent substrate. The first electrode 30 is a reflective electrode, and the second electrode 40 is a transparent electrode.

Since the optical property modification layer 31 having a lower reflectivity than the first electrode 30 is formed on an upper surface of the first electrode 30, the reflection of external light may be reduced.

The organic light-emitting display apparatus 3 is an AM type, and thus, at least one TFT connected to the first electrode 30 and at least one wiring portion (S, V, and D, refer to FIG. 5) connected to the at least one TFT is disposed between the first and second substrates 10 and 20. In one embodiment, the at least one TFT is disposed between the first substrate 10 and the first electrode 30.

A buffer layer 11 formed of $SiO_2$ and/or $SiN_x$ etc. is formed on the first substrate 10 to planarize the first substrate 10 and to prevent impurity elements from penetrating. An active layer 12 of the at least one TFT is formed on the buffer layer 11, and a gate insulation layer 13 is formed on the active layer 12. A gate electrode 14 is formed on the gate insulation layer 13. The gate electrode 14 is connected to a gate line S (refer to FIG. 5) that applies an on/off signal of the TFT. An interlayer insulation layer 15 is formed on the gate electrode 14, and source and drain electrodes 16 are respectively connected to source and drain areas of the active layer 12 (not shown) via contact holes. The light-blocking layer 60 is formed on the source and drain electrodes 16, and a passivation layer 17 is formed on the light-blocking layer 60. The first electrode 30 is connected to one of the source and drain electrodes 16 via a via hole in the passivation layer 17 and the light-blocking layer 60. The other one of the source and drain electrodes 16 is connected to a power wiring portion V (see FIG. 5). While a driving transistor is illustrated as the TFT in the drawings, the embodiment of the present invention is not limited thereto and other TFT types such as a switching transistor (not shown) may also be further included. In addition, a data wiring portion D (see FIG. 5) transmitting a data signal to a switching transistor (not shown) may be further included.

According to the current embodiment, the light-blocking layer 60 is disposed between the first substrate 10 and the first electrode 30, which is a reflective electrode. In detail, the light-blocking layer 60 is disposed between the TFT and the first electrode 30 and between the wiring portions S, V, and D connected to the TFT and the first electrode 30. In other words, the light-blocking layer 60 is formed to be disposed at a level higher than the TFT and the wiring portions S, V, and D connected to the TFT and at a level lower than the first electrode 30 when the first substrate 10 serves as a bottom substrate.

In general, the gate electrode 14, the source and drain electrodes 16 and the wiring portions S, V, and D constituting the TFT are formed of a metal having a high reflectivity. Accordingly, external light that is incident into the organic light-emitting display apparatus 3 through the second substrate 20 is reflected by the gate electrode 14, the source and drain electrodes 16, and the wiring portions S, V, and D of the TFT, and is then emitted together with light emitted from the organic light-emitting layer 50. The reflected external light may decrease a contrast of the organic light-emitting display apparatus 3.

However, the organic light-emitting display apparatus 3 according to the current embodiment of the present invention includes the light-blocking layer 60 disposed between the TFT and the first electrode 30 and between the wiring portions S, V, and D connected to the TFT and the first electrode 30, thereby reducing reflection of the external light. The light-blocking layer 60 may be formed of various materials. For example, the light-blocking layer 60 may be formed of Cr/CrOx or carbon black.

Referring to FIG. 6B, the light-blocking layer 60 may be formed on an area except an area where the optical property modification layer 31 is formed on the first electrode 30. Referring to FIG. 6A, although the optical property modification layer 31 is formed on the first electrode 30, the light-blocking layer 60 may be formed all over the area between the first electrode 30 and the TFT and between the first electrode 30 and the wiring portions S, V, and D connected to the TFT.

Accordingly, in the top emission AM type organic light-emitting display apparatus 3 according to the current embodiment of the present invention, a contrast may be enhanced by using the optical property modification layer 31 disposed on the surface of the first electrode 30, which is a reflective electrode, and the light-blocking layer 60 that is disposed between the first electrode 30 and the TFT and between the first electrode 30 and the wiring portions S, V, and D connected to the TFT.

The TFT illustrated in the drawings is an example, and the embodiment of the present invention is not limited thereto. Thus, various types of TFTs may be applied. The form of wiring portions may also vary.

Figure 7:
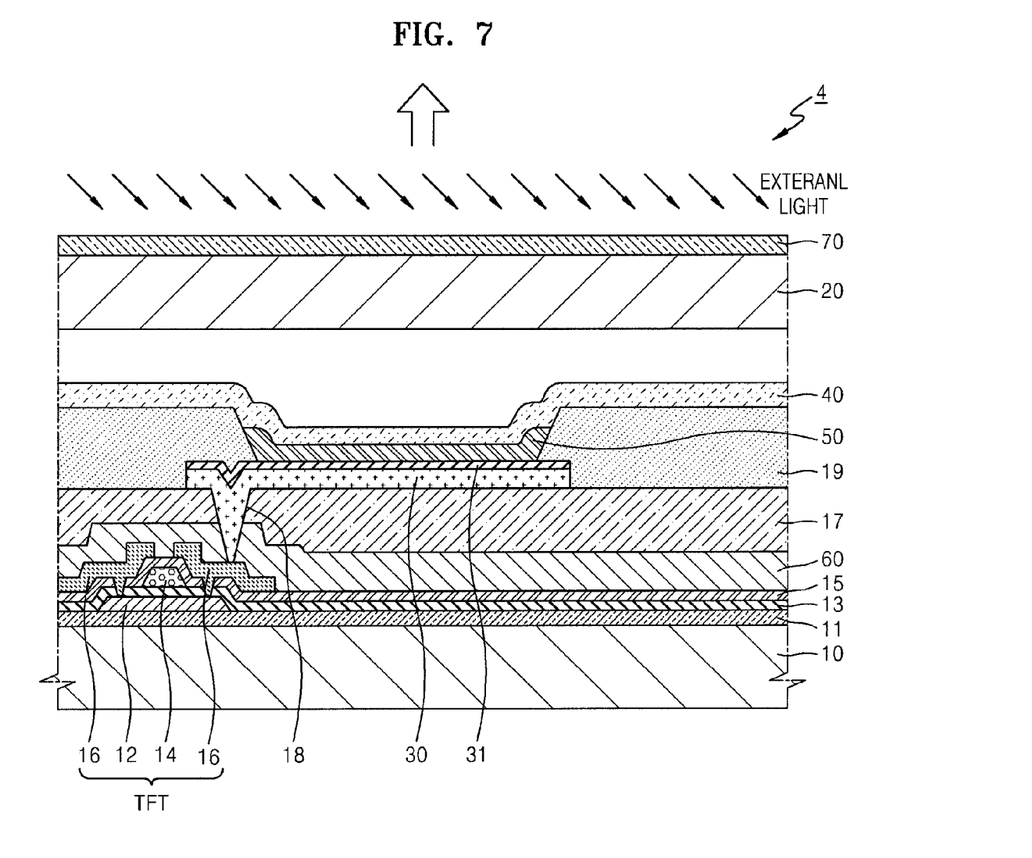
FIG. 7 is a schematic cross-sectional view illustrating a top emission AM type organic light-emitting display apparatus according to an embodiment of the present invention.

Hereinafter, an organic light-emitting display apparatus 4 according to another embodiment of the present invention will be described. Description of the organic light-emitting display apparatus 4 will focus on differences from the organic light-emitting display apparatus 3 of the previous embodiment, and like reference numerals in the drawings denote like elements.

Figure 8:
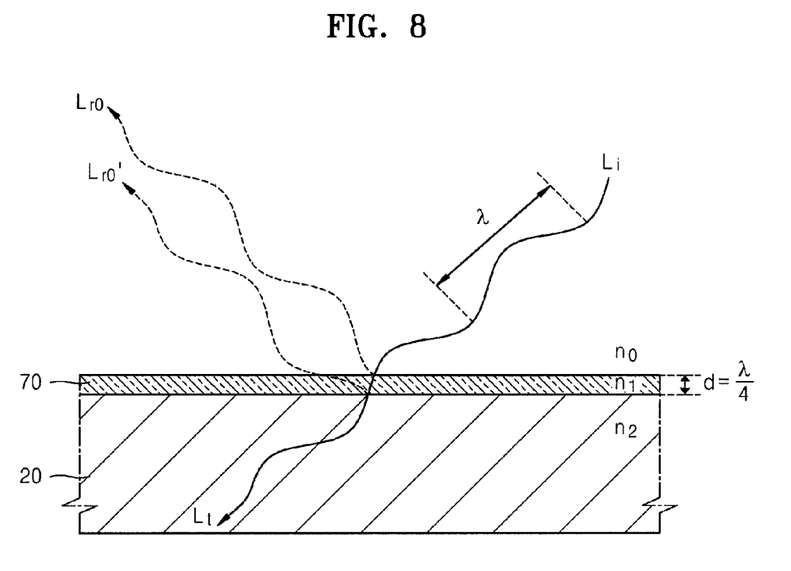
FIG. 8 is a schematic cross-sectional view illustrating a single transparent interference layer according to an embodiment of the present invention.
Figure 9:
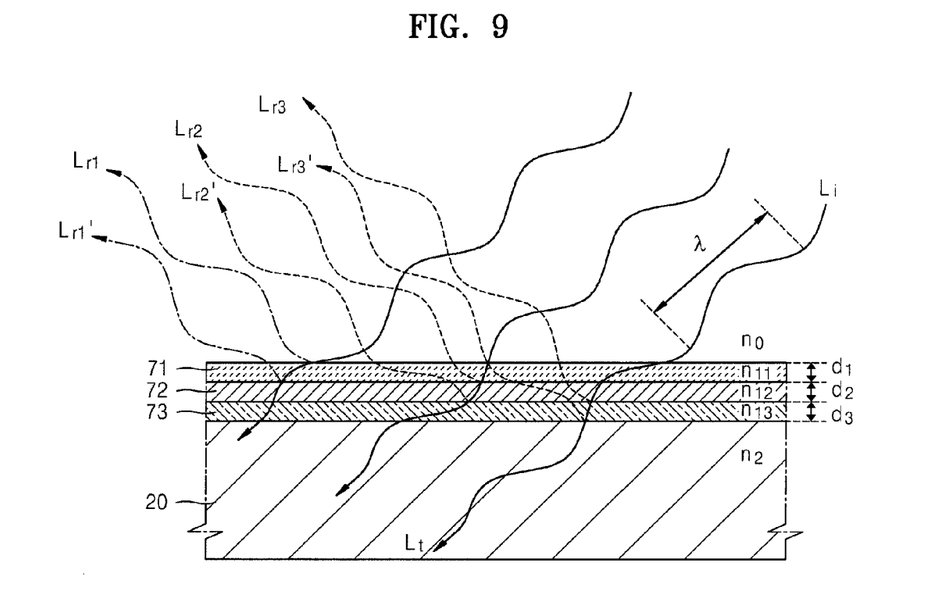
FIG. 9 is a schematic cross-sectional view illustrating transparent interference layers according to an embodiment of the present invention.

FIG. 7 is a schematic cross-sectional view illustrating a top emission AM type organic light-emitting display apparatus 4 according to an embodiment of the present invention. FIG. 8 is a schematic cross-sectional view illustrating a single transparent interference layer 70 according to an embodiment of the present invention. FIG. 9 is a schematic cross-sectional view illustrating transparent interference layers 71, 72, and 73 according to an embodiment of the present invention.

Referring to FIG. 7, the organic light-emitting display apparatus 4 includes a first substrate 10, a second substrate 20, a first electrode 30, an optical property modification layer 31 formed on a surface of the first electrode 30, an organic light-emitting layer 50, a second electrode 40, a light-blocking layer 60, and the transparent interference layer 70.

The transparent interference layer 70 is added to the above-described organic light-emitting display apparatus 3 to form the organic light-emitting display apparatus 4.

The transparent interference layer 70 is disposed on a surface of the second substrate 20, which is a transparent substrate, through which external light is incident. External light is transmitted through the second substrate 20 when incident on the organic light-emitting display apparatus 4, but a portion of the external light is directly reflected by a surface of the second substrate 20. Thus, the external light reflected by the surface of the second substrate 20 may be in a visual field of an observer, together with light emitted from the organic light-emitting layer 50, and thus, may decrease a contrast accordingly.

However, in the organic light-emitting display apparatus 4 according to the current embodiment of the present invention, the transparent interference layer 70 having a thickness corresponding to about ¼ of an external light wavelength is disposed on the surface of the second substrate 20 to reduce the reflection of the external light reflected by the surface of the second substrate 20.

Referring to FIG. 8, external light Li is transmitted from the outside through the transparent interference layer 70, and a portion thereof Lt is incident on the second substrate 20, and a portion thereof Lr0 is reflected by the surface of the transparent interference layer 70. The portion Lr0' of the incident light is reflected at a boundary between the second substrate 20 and the transparent interference layer 70. If a thickness d of the transparent interference layer 70 corresponds to ¼ of a wavelength λ of the external light Li, the reflection light Lr0 reflected by the transparent interference layer 70 and the reflection light Lr0' reflected by the second substrate 20 are offset by interference, and thus, the reflection of the external light on the surface of the second substrate 20 may be reduced.

The thickness d of the transparent interference layer 70 may be determined according to various conditions such as a wavelength of external light having the greatest intensity, an arithmetic average of wavelengths of visible light bands, or an arithmetic average of external light bands.

The transparent interference layer 70 may preferably have a refractive index n1 which is between a refractive index (n0=1) of the outside and a refractive index n2 of the second substrate 20. When a typical glass having a refractive index n1 of about 1.5 is used as the second substrate 20, the refractive index n1 of the transparent interference layer 70 is preferably about 1.23 but it is difficult to find a material having this refractive index exactly.

In the current embodiment, magnesium fluoride having a refractive index of about 1.38 is used as the transparent interference layer 70. Magnesium fluoride has good durability and is easily deposited using a physical vapor deposition (PVD) method. Also, silica or other various highly refractive transparent materials may be used as the transparent interference layers 70.

FIG. 9 illustrates the transparent interference layers 71, 72, and 73 formed on a surface of the second substrate 20.

Referring to FIG. 9, a portion Lt of external light Li is transmitted from the atmosphere into the plurality of transparent interference layers 71, 72, and 73 and is incident on the second substrate 20 (Lt). The nearer to the second substrate 20 the transparent interface layer is disposed, the greater the refractive index of the transparent interference layer is. In the illustrated embodiments, the refractive index n13 of the transparent interference layer 73 is greater than the refractive indices n11 and n12 of the transparent interference layers 71 and 72, and the refractive index n12 of the transparent interference layer 72 is greater than the refractive index n11 of the transparent interference layer 71. This can be expressed as 'n11<n12<n13.

A portion Lr1 of the external light Li is reflected by the first transparent interference layer 71, and a portion Lr1' of the incident light Lt is reflected at a boundary between the second transparent interference layer 72 and the first transparent interference layer 71. If a thickness d1 of the first transparent interference layer 71 corresponds to ¼ of a wavelength λ of the incident external light Li, the reflection light Lr1 reflected by the first transparent interference layer 71 and the reflection light Lr1' reflected by the boundary between the second transparent interference layer 72 and the first transparent interference layer 71 is offset by interference.

A portion Lr2 of the external light Li is reflected by the second transparent interference layer 72, and a portion Lr2' of the incident light Lt is reflected at a boundary between the third transparent interference layer 73 and the second transparent interference layer 72. If a thickness d2 of the second transparent interference layer 72 corresponds to ¼ of a wavelength λ of the incident external light Li, the reflection light Lr2 reflected by the second transparent interference layer 72 and the reflection light Lr2' reflected by the boundary between the third transparent interference layer 73 and the second transparent interference layer 72 is offset by interference.

A portion Lr3 of the external light Li is reflected by the third transparent interference layer 73, and a portion Lr3' of the incident light Lt is reflected at a boundary between the second substrate 20 and the third transparent interference layer 73. If a thickness d3 of the third transparent interference layer 73 corresponds to ¼ of a wavelength λ of the incident external light Li, the reflection light Lr3 reflected by the third transparent interference layer 73 and the reflection light Lr3' reflected by the boundary between the second substrate 20 and the third transparent interference layer 73 is offset by interference. Consequently, the reflection of the external light Li is reduced overall, thereby improving the contrast.

Hereinafter, an organic light-emitting display apparatus 5 according to another embodiment of the present invention will be described with reference to FIGS. 10 and 11. The description of the organic light-emitting display apparatus 5 will focus on differences from the organic light-emitting display apparatus 4 of the previous embodiment, and like reference numerals in the drawings denote like elements.

Figure 10:
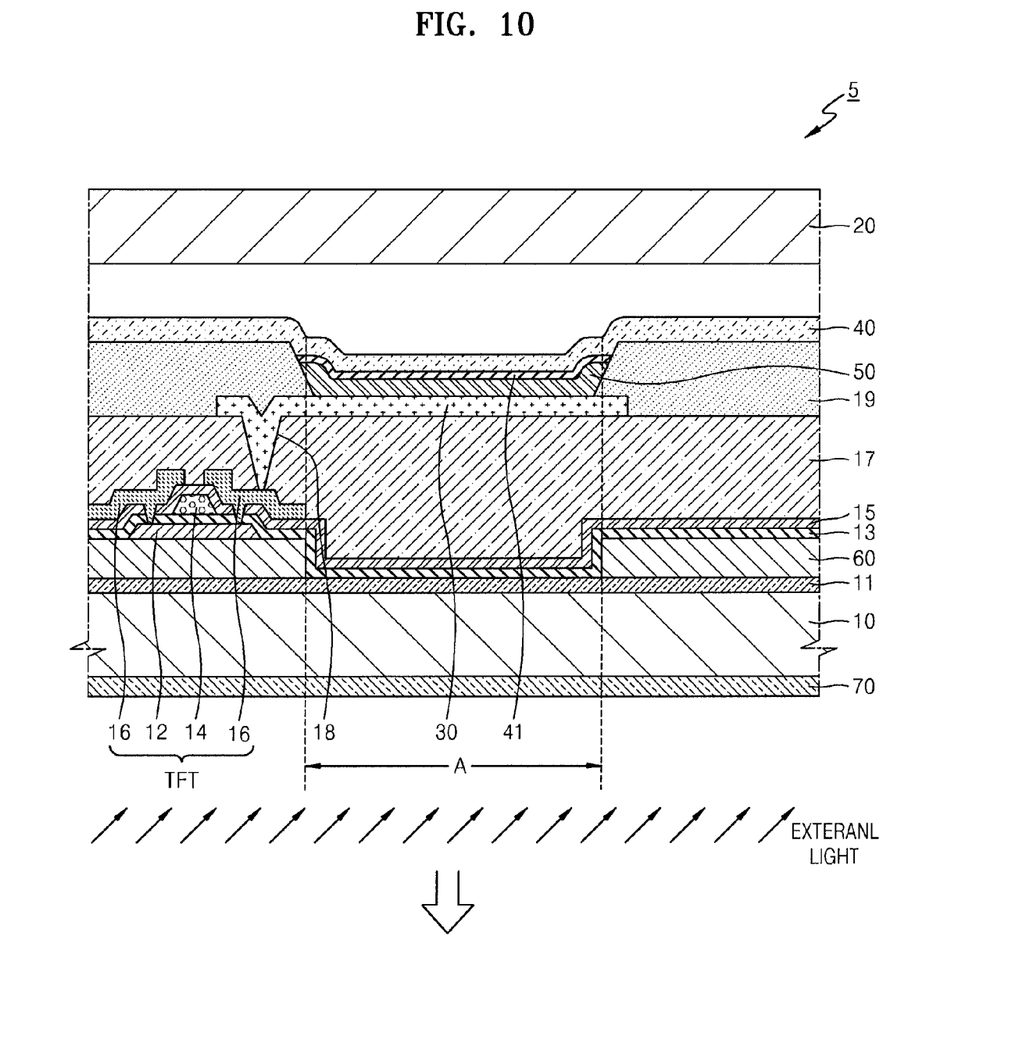
FIG. 10 is a schematic cross-sectional view illustrating a bottom emission AM type organic light-emitting display apparatus according to another embodiment of the present invention.

FIG. 10 is a schematic cross-sectional view illustrating a bottom emission AM type organic light-emitting display apparatus 5 according to another embodiment of the present invention. FIG. 11 is a schematic plan view illustrating a light-blocking layer 60 of the organic light-emitting display apparatus 5 shown in FIG. 10.

Figure 11:
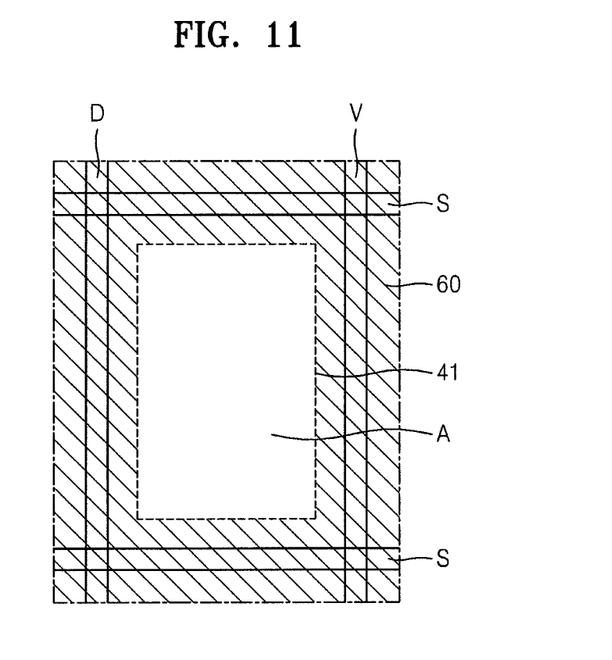
FIG. 11 is a schematic plan view illustrating a light-blocking layer of the organic light-emitting display apparatus of FIG. 10.

Referring to FIGS. 10 and 11, the organic light-emitting display apparatus 5 includes a first substrate 10, a second substrate 20, a first electrode 30, a second electrode 40, an optical property modification layer 41 formed on a surface of the second electrode 40, an organic light-emitting layer 50, a light-blocking layer 60, and a transparent interference layer 70.

Since the organic light-emitting display apparatus 5 is a bottom emission type in which light emitted from the organic light-emitting layer 50 is emitted toward the first substrate 10, the first substrate 10 is a transparent substrate. The second electrode 40 is a reflective electrode, and the first electrode 30 is a transparent electrode.

Since the optical property modification layer 41 having a lower reflectivity than the second electrode 40, which is a reflective electrode, is formed on the surface of the second electrode 40 facing the organic light-emitting layer 50, the reflection of external light may be reduced.

External light that is transmitted through the first substrate 10 and is incident into the organic light-emitting display apparatus 5 is reflected by a gate electrode 14, source and drain electrodes 16, and wiring portions S, V, and D constituting a TFT having a high reflectivity, and is emitted together with the light emitted from the organic light-emitting layer 50, which may decrease a contrast of the organic light-emitting display apparatus 5.

However, according to the current embodiment of the present invention, as the light-blocking layer 60 is disposed between the first substrate 10 and the TFT and between the first substrate 10 and the wiring portions S, V, and D connected to the TFT, the reflection of the external light may be reduced.

When the optical property modification layer 41 is formed only in a portion A of the second electrode 40 which is a common electrode, the light-blocking layer 60 may be disposed only in an area except the portion A where the optical property modification layer 41 is formed.

The transparent interference layer 70 is formed on a surface of the first substrate 10, which is a transparent substrate, through which external light is incident. The transparent interference layer 70 may reduce the amount of external light that is directly reflected by a surface of the second substrate 20, thereby improving the contrast.

According to the organic light-emitting display apparatus of the embodiments of the present invention, the following effects are provided.

First, an optical property modification layer is formed on a surface of a reflective electrode, thereby minimizing a decrease in contrast by reducing the reflection of external light due to a reflective electrode without using another additional element.

Second, by forming a light-blocking layer between a thin-film transistor and wiring portions and a reflection electrode, the reflection of external light due to the wiring portion may be reduced to improve the contrast.

Third, by forming a transparent interference layer on a transparent substrate of a display apparatus, the reflection of external light due to the wiring portions is reduced to improve the contrast.

While the present invention has been particularly shown and described with reference to embodiments thereof, it will be understood by those of ordinary skill in the art that various changes in form and details may be made therein without departing from the spirit and scope of the present invention as defined by the following claims.

What is claimed is:

1. An organic light-emitting display apparatus comprising:
a first substrate;
a second substrate opposing the first substrate and comprising a display surface;
a first electrode disposed between the first substrate and the second substrate;
a second electrode disposed between the first electrode and the second substrate; and
an organic light-emitting layer disposed between the first electrode and the second electrode,
wherein the first electrode is made of a conductive material and comprises a top surface which faces the second substrate and is laser-modified such that reflection on the top surface is substantially minimized compared to the top surface without such laser-modification.

2. The organic light-emitting display apparatus of claim 1, wherein the top surface being laser modified such that at least one optical property selected from the group consisting of transmittivity, refractive index, diffraction, and color is modified.

3. The organic light-emitting display apparatus of claim 1, wherein the top surface is laser-modified by applying a femtosecond duration laser beam pulse at least once to the reflective electrode.

4. The organic light-emitting display apparatus of claim 3, wherein an area of the laser-modification of the top surface by the femtosecond duration laser beam has a nano-scale or micro-scale size.

5. The organic light-emitting display apparatus of claim 1, wherein the top surface faces the organic light-emitting layer.

6. The organic light-emitting display apparatus of claim 1, wherein light emitted from the organic light-emitting layer is emitted toward the second substrate,
wherein a light-blocking layer is further formed between the first substrate and the organic light-emitting layer.

7. The organic light-emitting display apparatus of claim 6, further comprising at least one thin-film transistor (TFT) connected to the first electrode and at least one wiring portion connected to the at least one TFT,
wherein the at least one TFT and the at least one wiring portion are formed between the first substrate and the second substrate, and
the light-blocking layer is formed between the at least one TFT and the first electrode or between the at least one wiring portion and the first electrode.

8. The organic light-emitting display apparatus of claim 7, wherein the light-blocking layer is formed on an area which does not overlap the laser-modified top surface when viewed in a direction perpendicular to the display surface.

9. The organic light-emitting display apparatus of claim 1, wherein the second substrate is a transparent substrate, and at least one transparent interference layer is further formed on a surface of the second substrate through which external light is incident.

10. The organic light-emitting display apparatus of claim 9, wherein the transparent interference layer has a thickness equivalent to about ¼ wavelength of the external light.

11. The organic light-emitting display apparatus of claim 9, wherein the transparent interference layer has a smaller refractive index than a refractive index of the transparent substrate.

12. The organic light-emitting display apparatus of claim 11, wherein the transparent interference layer comprises at least one material selected from the group consisting of magnesium fluoride, silica, and a highly refractive transparent material.

13. The organic light-emitting display apparatus of claim 9, wherein the at least one transparent interference layer comprises a plurality of transparent interference layers, each of which has a thickness equivalent to about ¼ wavelength of the external light.

14. An organic light-emitting display apparatus comprising:
a first substrate comprising a display surface;
a second substrate opposing the first substrate;
a first electrode disposed between the first substrate and the second substrate and a second electrode disposed between the first electrode and the second substrate; and
an organic light-emitting layer disposed between the first electrode and the second electrode,
wherein the second electrode is made of a conductive material and comprising a surface which faces the first substrate and is laser-modified such that reflection on the surface is substantially minimized compared to the surface without such laser-modification,
wherein light emitted from the organic light-emitting layer is emitted toward the first substrate,
wherein a light-blocking layer is further formed between the first substrate and the first electrode.

15. The organic light-emitting display apparatus of claim 14, further comprising at least one thin-film transistor (TFT) connected to the first electrode and at least one wiring portion connected to the at least one TFT,
wherein the at least one TFT and the at least one wiring portion are formed between the first substrate and the second substrate, and
the light-blocking layer is formed between the at least one TFT and the first electrode or between the at least one wiring portion and the first electrode.

16. The organic light-emitting display apparatus of claim 15, wherein the light-blocking layer is formed on an area in which the laser-modified surface is not formed.

17. An organic light-emitting display apparatus comprising:
a first substrate;
a second substrate disposed to face the first substrate;
a first electrode disposed between the first substrate and the second substrate and a second electrode disposed to face the first electrode; and
an organic light-emitting layer disposed between the first electrode and the second electrode,
wherein at least one of the first electrode and the second electrode is a reflective electrode, and wherein an optical property modification layer having at least one optical property modified from that of the reflective electrode is formed on a surface of the reflective electrode,
wherein at least one of the first substrate and the second substrate is a transparent substrate, and at least one transparent interference layer is further formed on a surface of the transparent substrate through which external light is incident,
wherein the at least one transparent interference layer comprises a first transparent interference layer and a second transparent interference layer which is closer to the transparent substrate than the first transparent interference layer and has a refractive index higher than that of the first transparent interference layer.

* * * * *